(12) United States Patent
Chen et al.

(10) Patent No.: US 9,449,661 B2
(45) Date of Patent: *Sep. 20, 2016

(54) MEMORY DEVICE

(71) Applicant: TAIWAN SEMICONDUCTOR MANUFACTURING COMPANY, LTD., Hsinchu (TW)

(72) Inventors: Yen-Huei Chen, Hsinchu (TW);
Li-Wen Wang, Hsinchu (TW);
Chih-Yu Lin, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/799,780

(22) Filed: Jul. 15, 2015

(65) Prior Publication Data

US 2015/0318036 A1 Nov. 5, 2015

Related U.S. Application Data

(63) Continuation of application No. 14/291,162, filed on May 30, 2014, now Pat. No. 9,105,326, which is a continuation of application No. 13/562,222, filed on Jul. 30, 2012, now Pat. No. 8,773,923.

(51) Int. Cl.
*G11C 7/22* (2006.01)
*G11C 7/12* (2006.01)
*G11C 11/419* (2006.01)

(52) U.S. Cl.
CPC . *G11C 7/22* (2013.01); *G11C 7/12* (2013.01); *G11C 11/419* (2013.01)

(58) Field of Classification Search
CPC .......... G11C 7/22; G11C 7/12; G11C 11/419
USPC ............... 365/189.11, 189.09, 154, 226, 191
See application file for complete search history.

(56) References Cited

U.S. PATENT DOCUMENTS

| | | | |
|---|---|---|---|
| 4,310,900 | A | 1/1982 | Tsujide |
| 5,506,805 | A | 4/1996 | Hirose et al. |
| 5,715,191 | A | 2/1998 | Yamauchi et al. |
| 6,028,793 | A | 2/2000 | Manstretta et al. |
| 6,307,793 | B1 | 10/2001 | Murakami |
| 6,781,870 | B1* | 8/2004 | Kushida ................ G11C 11/417 365/154 |
| 7,701,755 | B2 | 4/2010 | Chen et al. |
| 2009/0097325 | A1* | 4/2009 | Won ................... G11C 16/3454 365/185.22 |
| 2011/0235406 | A1 | 9/2011 | Jung et al. |
| 2012/0014172 | A1 | 1/2012 | Jung et al. |
| 2012/0051151 | A1 | 3/2012 | Wu et al. |

(Continued)

OTHER PUBLICATIONS

Office Action dated Mar. 12, 2015 from corresponding No. TW 101137358.

*Primary Examiner* — Tan T. Nguyen
(74) *Attorney, Agent, or Firm* — Hauptman Ham, LLP

(57) ABSTRACT

A memory device includes a memory cell electrically connected to a power line and a power supply unit configured to control a voltage level on the power line. The power supply unit receives a control signal corresponding to a write cycle of the memory cell and, responsive to a first state of the control signal, outputs a first voltage level on the power line. Responsive to a second state of the control signal, the power supply unit outputs a second voltage level on the power line, the second voltage level having a magnitude less than a magnitude of the first voltage level.

20 Claims, 12 Drawing Sheets

(56) References Cited

U.S. PATENT DOCUMENTS

2012/0188838 A1 7/2012 Cheng et al.
2013/0294149 A1* 11/2013 Deng .................. G11C 5/14
                                                365/156
2013/0343135 A1* 12/2013 Baeck .................. G11C 7/12
                                                365/189.11

* cited by examiner

MEMORY DEVICE

PRIORITY CLAIM

The present application is a continuation of U.S. application Ser. No. 14/291,162, filed May 30, 2014, now U.S. Pat. No. 9,105,326, issued Aug. 11, 2015, which is a continuation of U.S. application Ser. No. 13/562,222, filed Jul. 30, 2012, now U.S. Pat. No. 8,773,923, issued Jul. 8, 2014, which are incorporated by reference herein in their entireties.

TECHNICAL FIELD

The present disclosure relates to a method for writing a memory cell, and more particularly to a method for writing a memory cell in a specific write cycle.

BACKGROUND

The static random access memory (SRAM) cell generally includes a first inverter, a second inverter, a first pass transistor and a second pass transistor. The first and the second inverters are cross-coupled to form a bistable latch circuit. The first pass transistor is coupled between the first inverter and a first bit line. The second pass transistor is coupled between the second inverter and a second bit line. In order to set or reset the bistable latch circuit, the first and the second pass transistors are enabled by driving a word line and accessed by driving the first and the second bit lines. Each of the first and the second inverters includes a respective p-type metal oxide semiconductor (PMOS) pull-up or load transistor, a respective n-type MOS (NMOS) pull-down or driver transistor, and a respective storage node between the respective PMOS pull-up transistor and the respective NMOS pull-down transistor.

When the SRAM cell has a static noise margin (SNM) near zero, it may have a weak write property, and thus may inadvertently flip its state. The SNM is a measure of the logic circuit's tolerance to noise in either of the states, i.e. by how much does the input voltage change without disturbing the present logic state. In other words, the SNM represents a measure of cell robustness.

When the size of the SRAM cell is scaled down, the SRAM cell has the huge device mismatch due to the process variation. A write operation to the SRAM cell is enabled by asserting a desired bit value on the first bit line and a complement of that value on the second bit line, and asserting the word line. A reduced static noise margin (SNM) can lead to cell upsets during a read operation or to unaccessed memory cells during the write operation. When the SRAM cell is powered by an extremely low supply voltage, it suffers a serious write failure due to the huge device mismatch.

SUMMARY

In accordance with one aspect of the present disclosure, a memory device is provided. The memory device includes a memory cell, a first pull-down unit and a second pull-down unit coupled to the first pull-down unit. The memory cell is to be written in a specific write cycle. The first and the second pull-down units are sequentially switched in the specific write cycle.

In accordance with another aspect of the present disclosure, a method for writing a memory cell in a specific write cycle is provided. The method includes the following steps. A first signal having a first transition edge is provided in the specific write cycle. A second signal having a second transition edge is provided in the specific write cycle, wherein the second transition edge and the first transition edge are out of phase. A first voltage level is provided to the memory cell. The first voltage level is lowered to a second voltage level in the specific write cycle for writing the memory cell in response to the first and the second transition edges.

In accordance with one more aspect of the present disclosure, a method for writing a memory cell in a specific write cycle is provided. The method includes the following steps. A first signal having a first transition edge is provided in the specific write cycle. A second signal having a second transition edge is provided in the specific write cycle, wherein the second transition edge lags behind the first transition edge. A first voltage level is provided to the memory cell. The first voltage level is lowered to a second voltage level in the specific write cycle for writing the memory cell in response to the second transition edge.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1A:
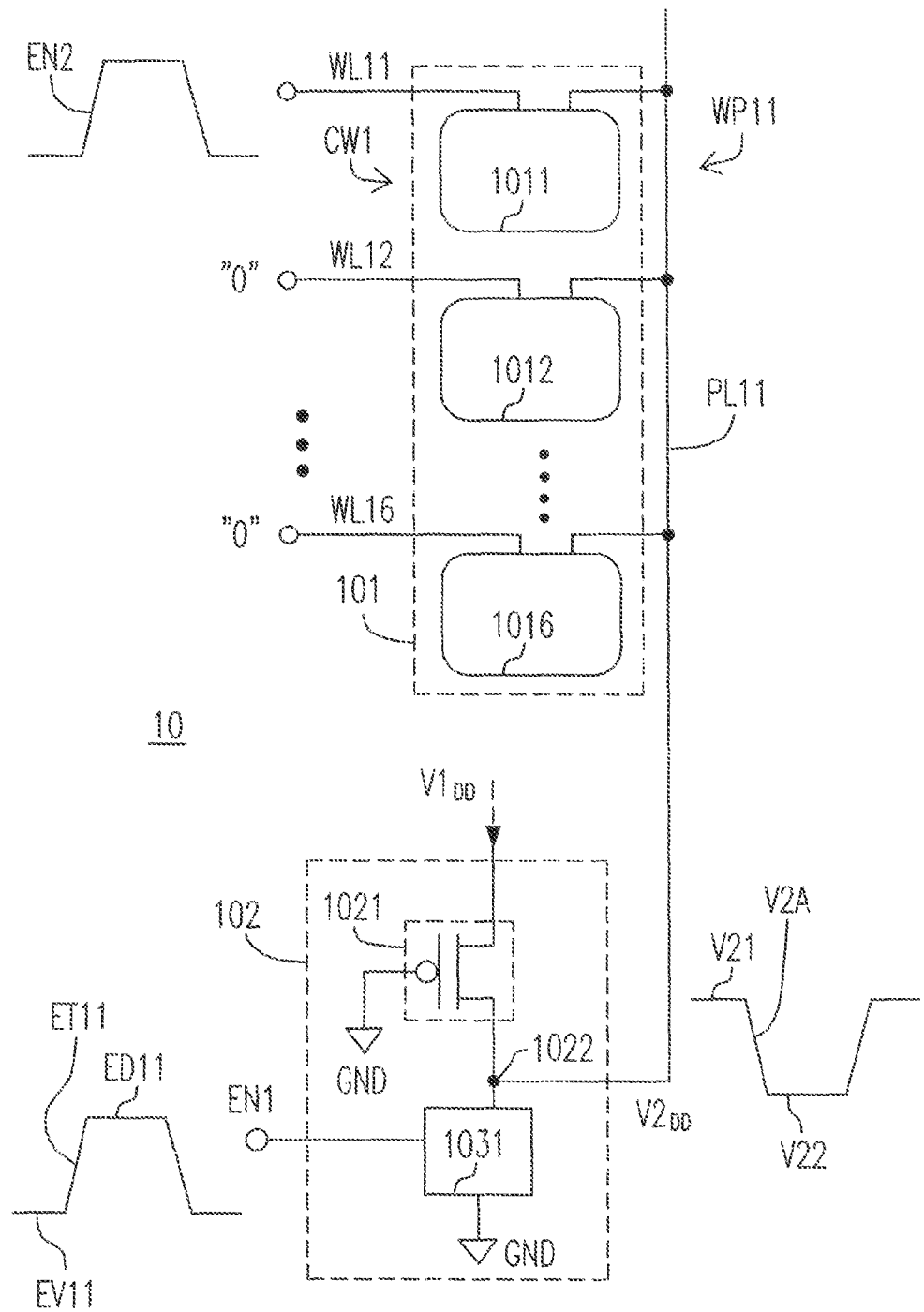
FIG. 1A is a schematic diagram showing a memory device according to a first embodiment of the present disclosure.

FIG. 1A is a schematic diagram showing a memory device 10 according to a first embodiment of the present disclosure. The memory device 10 includes a memory array 101 and a power supply unit 102 coupled to the memory array 101. The power supply unit 102 receives a positive supply voltage $V1_{DD}$, and converts the positive supply voltage $V1_{DD}$ into a supply voltage $V2_{DD}$ for powering the memory array 101 in response to an enable signal EN1.

In one embodiment, the memory array 101 includes a power line PL11, a plurality of memory cells 1011,

1012 . . . and 1016, and a plurality of word lines WL11, WL12 . . . and WL16 coupled to the plurality of memory cells 1011, 1012 . . . and 1016, respectively. The plurality of memory cells 1011, 1012 . . . and 1016 constitute a column of the memory array 101. The power line PL11 transmits the supply voltage V2$_{DD}$ to the plurality of memory cells 1011, 1012 . . . and 1016. For instance, the memory array 101 is an SRAM array, and the memory cell 1011 is an SRAM cell.

In one embodiment, the power supply unit 102 includes a pull-up unit 1021, a pull-down unit 1031 and a node 1022 disposed between the pull-up unit 1021 and the pull-down unit 1031. The pull-up unit 1021 is active under the positive supply voltage V1$_{DD}$. For instance, the pull-up unit 1021 includes a PMOS transistor, which has a gate terminal coupled to the ground GND.

In one embodiment, the pull-down unit 1031 is switched in response to the enable signal EN1. The enable signal EN1 has a disable level EV11, an enable level ED11 and a transition edge ET11 changed from the disable level EV11 to the enable level ED11. The supply voltage V2$_{DD}$ may be an internal supply voltage, and be pulled up to a voltage level V21 by the positive supply voltage V1$_{DD}$ when the pull-down unit 1031 is turned off in response to the disable level EV11, wherein the voltage level V21 is near the positive supply voltage V1$_{DD}$. The power supply unit 102 lowers the supply voltage V2$_{DD}$ from the voltage level V21 to a voltage level V22 to have a transition edge V2A when the pull-down unit 1031 is turned on in response to the transition edge ET11. For instance, the pull-down unit 1031 includes an NMOS transistor, which has a gate terminal receiving the enable signal EN1.

In one embodiment, the memory device 10 is configured to make a specific write operation WP11 to the memory cell 1011 in a specific write cycle CW1. For the specific write operation WP11 in the specific write cycle CW1, the pull-down unit 1031 is turned on in response to the enable signal EN1, and the memory cell 1011 is selected from the plurality of memory cells 1011, 1012 . . . and 1016 by driving the word line WL11 with an enable signal EN2. For instance, the memory cell 1011 is a selected cell in the specific write cycle CW1, and the memory cells 1012 . . . and 1016 are unselected cells therein.

In one embodiment, the memory device 10 in FIG. 1A may be in one of a plurality of conditions, wherein the plurality of conditions include a first condition and a second condition. The memory cell 1011 has a first weak write property when the memory device 10 is in the first condition. The memory cell 1011 has a second weak write property when the memory device 10 is in the second condition.

Figure 1B:
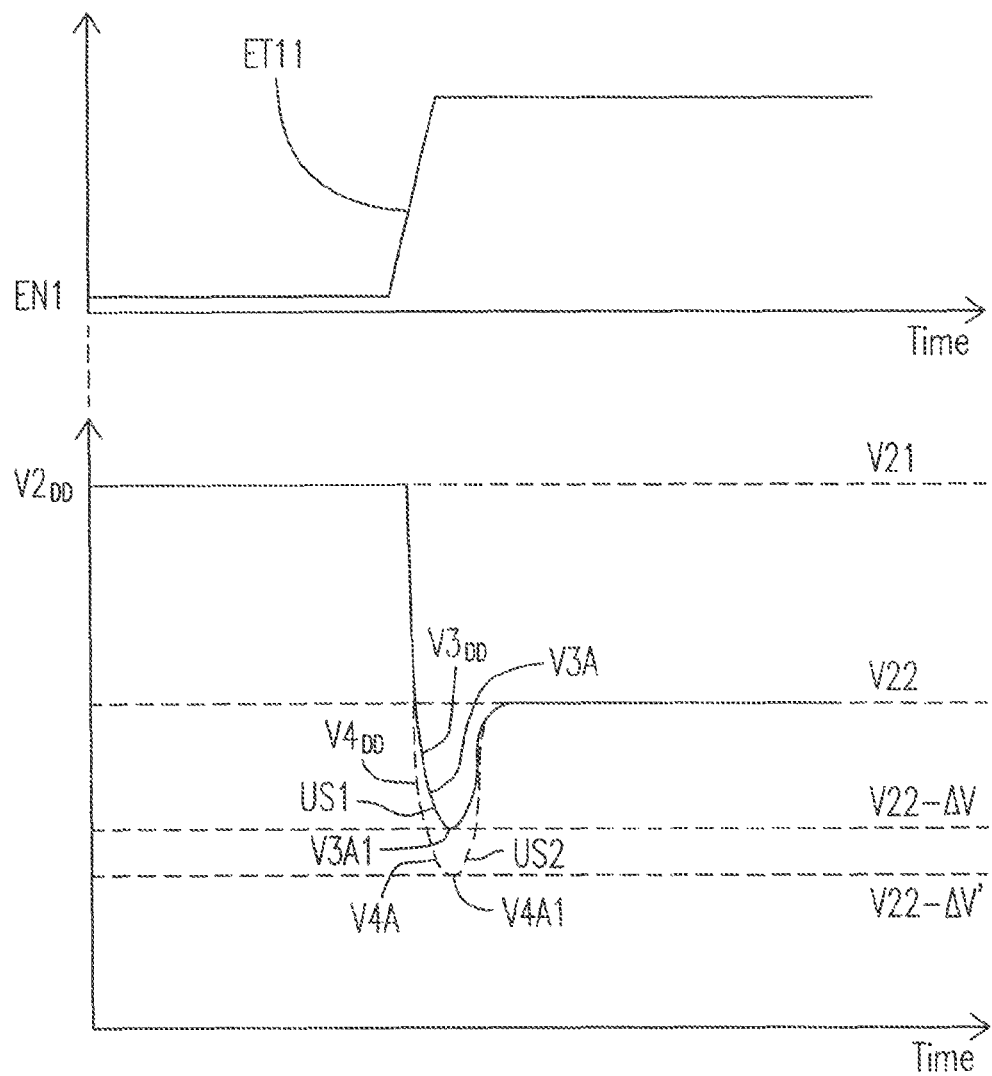
FIG. 1B is a schematic diagram showing waveforms obtained from the memory device in FIG. 1A.

FIG. 1B is a schematic diagram showing waveforms obtained from the memory device 10 in FIG. 1A. The waveforms in FIG. 1B show the enable signal EN1, the supply voltage V2$_{DD}$ (denoted to be V3$_{DD}$) in the first condition and the supply voltage V2$_{DD}$ (denoted to be V4$_{DD}$) in the second condition, respectively.

The supply voltages V3$_{DD}$ and V4$_{DD}$ have a transition edge V3A and a transition edge V4A, respectively, each of which has a respective undershoot. The transition edges V3A and V4A have an undershoot US1 and an undershoot US2, respectively, and have a minimum voltage V3A1 (=V22−ΔV) and a minimum voltage V4A1 (=V22−ΔV'), respectively.

Figure 1C:
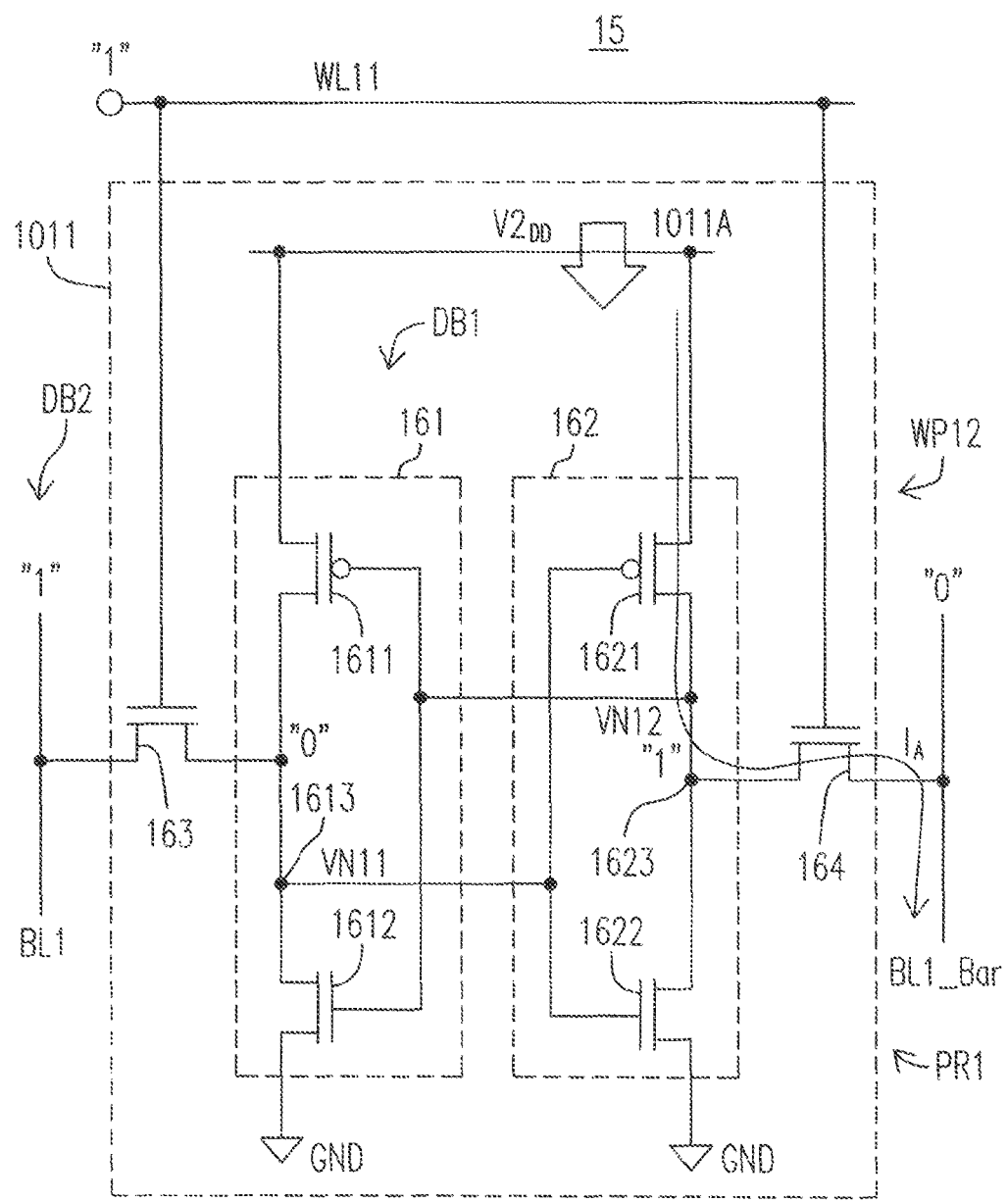
FIG. 1C is a schematic diagram showing a configuration associated with the memory cell in FIG. 1A.

FIG. 1C is a schematic diagram showing a configuration 15 associated with the memory cell 1011 in FIG. 1A. The configuration 15 includes the memory cell 1011, the word line WL11 and a pair PR1 of bit lines BL1 and BL1_Bar, wherein the memory array 101 includes the configuration 15. The memory cell 1011 in FIG. 1C may have a weak write property when the memory device 10 is in a specific condition (such as the first condition). The memory cell 1011 includes a power input terminal 1011A, an inverter 161, an inverter 162, a pass transistor 163 and a pass transistor 164.

The inverter 161 includes a PMOS pull-up transistor 1611, an NMOS pull-down transistor 1612 and a storage node 1613 disposed between the PMOS pull-up transistor 1611 and the NMOS pull-down transistor 1612. The inverter 162 includes a PMOS pull-up transistor 1621, an NMOS pull-down transistor 1622 and a storage node 1623 disposed between the PMOS pull-up transistor 1621 and the NMOS pull-down transistor 1622. Each of the PMOS pull-up transistor 1611 and the PMOS pull-up transistor 1621 receives the supply voltage V2$_{DD}$ from the power input terminal 1011A. The storage nodes 1613 and 1623 have a node voltage VN11 and a node voltage VN12, respectively.

The memory cell 1011 has stored a data bit DB1 having a value of 0; that is, the node voltage VN11 is in a logical low state and the node voltage VN12 is in a logical high state. The memory cell 1011 is to be written a data bit DB2 having a value of 1 in a specific write operation WP12 when the memory cell 1011 has stored the data bit DB1. As shown in FIG. 1C, when the memory cell 1011 is written the data bit DB2, each of the PMOS pull-up transistor 1621 and the pass transistor 163 is turned on to form a current I$_4$ flowing from the power input terminal 1011A through the PMOS pull-up transistor 1621 and the pass transistor 163 to the bit line BL1_Bar. Because of the weak write property of the memory cell 1011 in the specific condition, the supply voltage V2$_{DD}$ may be caused to have an undershoot under the on-current path of the current I$_4$.

The supply voltage V2$_{DD}$ may have a fast slew rate, and the voltage level V22 of the supply voltage V2$_{DD}$ may have an unlimited duration. In addition, the undershoot US3 of the supply voltage V2$_{DD}$ may be caused for the shorter bit-line length design, and may result in the retention concern for the unselected memory cells 1012 . . . and 1016.

Figure 2A:
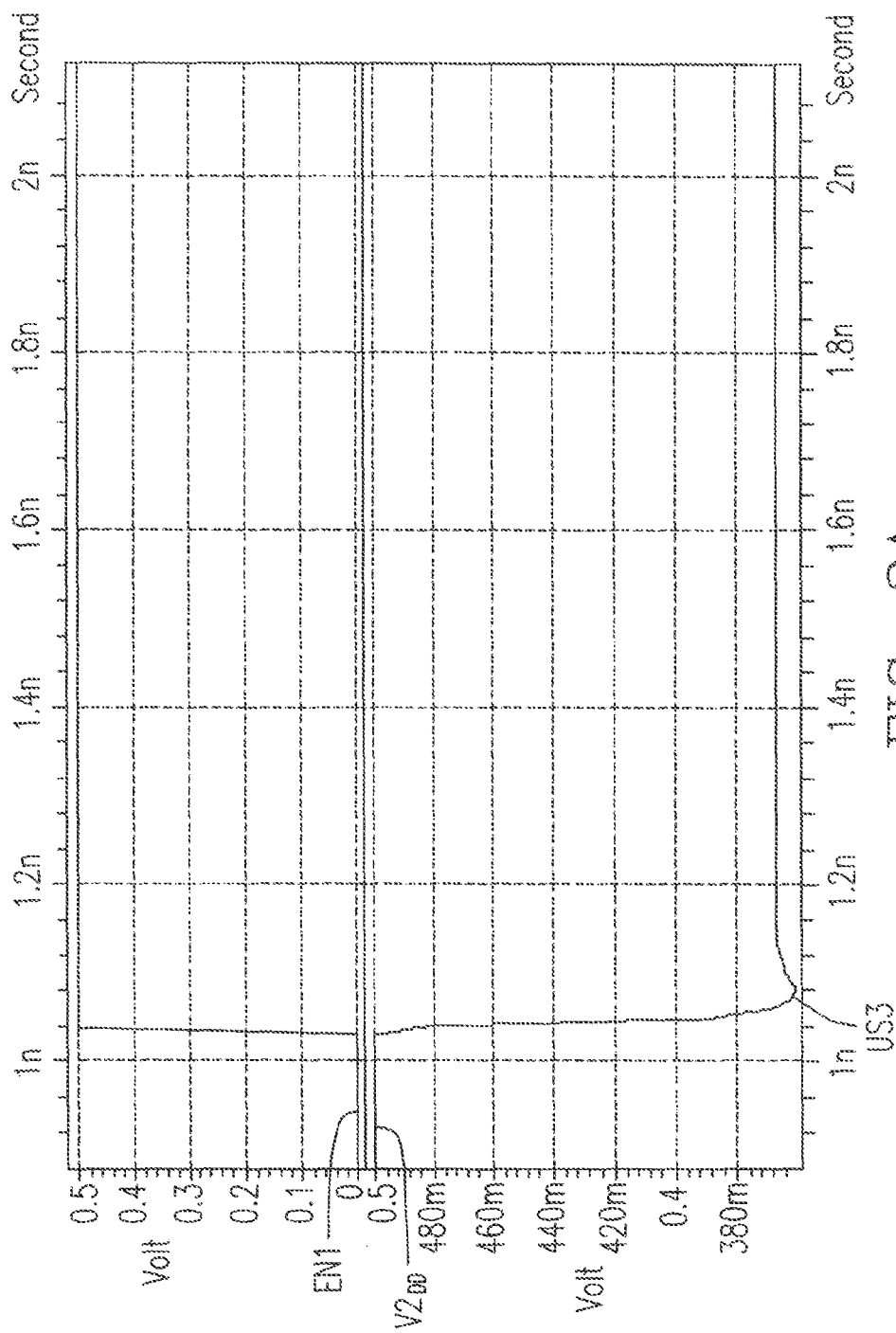
FIG. 2A and FIG. 2B are schematic diagrams showing waveforms obtained from the memory device in FIG. 1A.
Figure 2B:
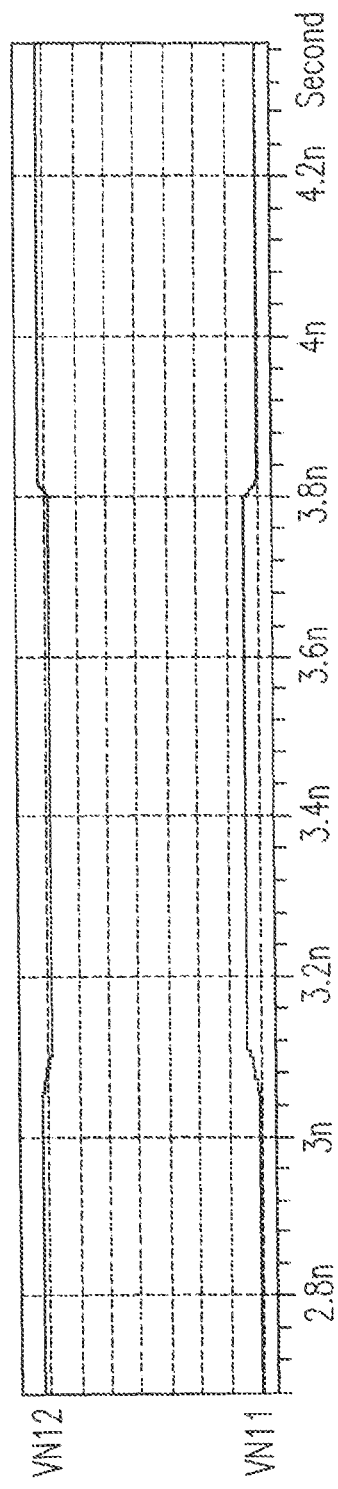

FIG. 2A and FIG. 2B are schematic diagrams showing waveforms obtained from the memory device 10 in FIG. 1A. The waveforms in FIG. 2A show the enable signal EN1 and the supply voltage V2$_{DD}$ for the specific write operation WP12 to the memory cell 1011, respectively. The waveforms in FIG. 2B show the node voltage VN11 and the node voltage VN12 (shown in FIG. 1C) for the specific write operation WP12 to the memory cell 1011, respectively. According to the waveforms in FIGS. 2A and 2B, the specific write operation WP12 to the memory cell 1011 fails, wherein the write failure may result from the undershoot US3 in the supply voltage V2$_{DD}$.

In one embodiment, the process of the fin-type field effect transistor (FinFET) technology may make the write margin of the memory cell 1011 even worse due to the Beta ratio equal to 1 and the stronger PMOS strength of the memory cell 1011. The power-line voltage lowering of the supply voltage V2$_{DD}$ may serve as a write assist since it may cause the memory device 10 to have less area consumption. However, how to keep the voltage lowering level may be a challenge.

Figure 3:
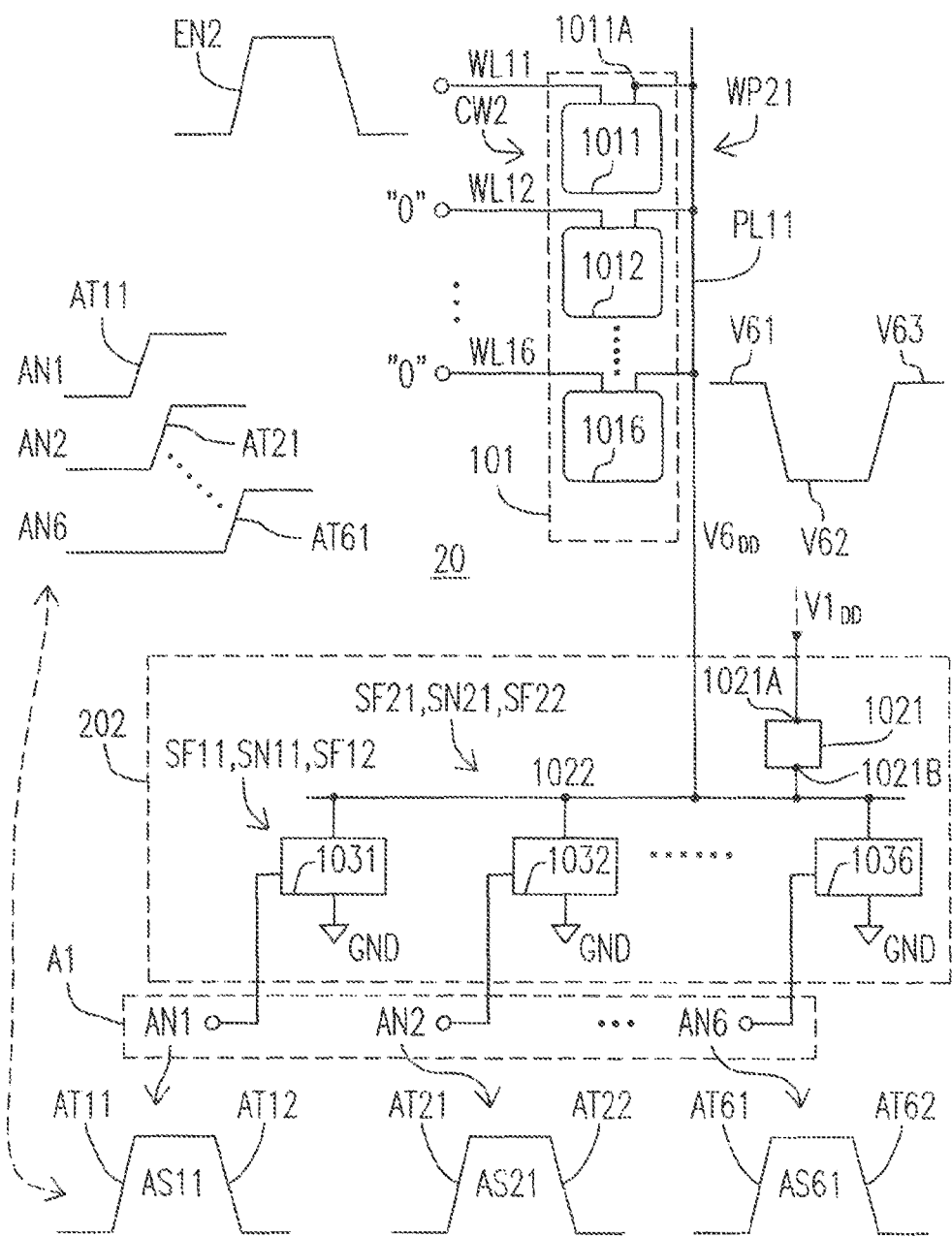
FIG. 3 is a schematic diagram showing a memory device according to a second embodiment of the present disclosure.

FIG. 3 is a schematic diagram showing a memory device 20 according to a second embodiment of the present disclosure. In one embodiment, the memory device 20 includes a memory cell 1011, a pull-down unit 1031 and a pull-down unit 1032 coupled to the pull-down unit 1031. The memory cell 1011 is to be written in a specific write cycle CW2, and the pull-down units 1031 and 1032 are sequentially switched in the specific write cycle CW2.

In one embodiment, the memory device 20 includes a memory array 101 as shown in FIG. 1A and a power supply unit 202 coupled to the memory array 101. In FIG. 3, the power supply unit 202 receives a positive supply voltage $V1_{DD}$, and converts the positive supply voltage $V1_{DD}$ into a supply voltage $V6_{DD}$ for powering the memory array 101 in response to a control signal A1, wherein the supply voltage $V6_{DD}$ may be an internal supply voltage, and the control signal A1 may include a plurality of signals AN1, AN2 . . . and AN6. The power line PL11 of the memory array 101 transmits the supply voltage $V6_{DD}$ to the plurality of memory cells 1011, 1012 . . . and 1016.

In one embodiment, the memory device 10 is configured to make a specific write operation WP21 to the memory cell 1011 in the specific write cycle CW2. For the specific write operation WP21 in the specific write cycle CW2, the supply voltage $V6_{DD}$ is lowered from a voltage level V61 to a voltage level V62, and the memory cell 1011 is selected from the plurality of memory cells 1011, 1012 . . . and 1016 by asserting the word line WL11 without asserting the word lines WL12 . . . and WL16. For instance, the memory cell 1011 is a selected cell in the specific write cycle CW2, and the memory cells 1012 . . . and 1016 are unselected cells therein.

In one embodiment, the memory device 20 has the positive supply voltage $V1_{DD}$; the memory cell 1011 includes a power input terminal 1011A; and the power supply unit 202 includes a pull-up unit 1021, a node 1022 and the pull-down units 1031 and 1032. The node 1022 is coupled to the power input terminal 1011A and transmits the supply voltage $V6_{DD}$ to the memory cell 1011 through the power line PL11. The pull-up unit 1021 includes a terminal 1021A receiving the positive supply voltage $V1_{DD}$ and a terminal 1021B coupled to the node 1022, wherein the pull-down unit 1031 is connected in parallel with the pull-down unit 1032 through the node 1022.

In one embodiment, the pull-down units 1031 and 1032 may include two transistors, respectively; and the two transistors may have two channel-width-to-channel-length ratios, which may be the same or different. The supply voltage $V6_{DD}$ may be pulled up to the voltage level V61 by the positive supply voltage $V1_{DD}$ when the pull-down unit 1031 is turned off to be in an off-state SF11 and the pull-down unit 1032 is turned off to be in an off-state SF21, wherein the voltage level V61 may be near the positive supply voltage $V1_{DD}$.

The supply voltage $V6_{DD}$ may be pulled down from the voltage level V61 to the voltage level V62 for writing the memory cell 1011 when the pull-down units 1031 and 1032 are sequentially turned on in the specific write cycle CW2 to change the off-state SF11 into an on-state SN11 and the off-state SF21 into an on-state SN21 sequentially. The supply voltage $V6_{DD}$ may be pulled up from the voltage level V62 to a voltage level V63 when the pull-down units 1031 and 1032 are turned on to change the on-state SN11 into an off-state SF12 and the on-state SN21 into an off-state SF22 respectively.

In one embodiment, the pull-down unit 1031 receives the signal AN1 having a transition edge AT11 and is turned on to be in the on-state SN11 in response to the transition edge AT11. The pull-down unit 1032 receives the signal AN2 having a transition edge AT21 lagging behind the transition edge AT11, and is turned on to be in the on-state SN21 in response to the transition edge AT21. The signal AN1 may be an enable signal, and further have a transition edge AT12 and an enable duration AS11 between the transition edges AT11 and AT12; and the signal AN2 may be an enable signal, and further have a transition edge AT22 and an enable duration AS21 between the transition edges AT21 and AT22.

In one embodiment, the pull-down unit 1031 is turned off to be in the off-state SF12 in response to the transition edge AT12, and the pull-down unit 1032 is turned off to be in the off-state SF22 in response to the transition edge AT22. The transition edge AT22 may be in one of a first state and a second state. The first state is that the transition edge AT22 is in phase with the transition edge AT12; and the second state is that the transition edge AT22 leads the transition edge AT12. For instance, the transition edges AT11 and AT21 are two rising edges, respectively, and each of the transition edges AT11 and AT21 occurs in the specific write cycle CW2. For instance, the transition edges AT12 and AT22 are two falling edges, respectively. In one embodiment, each of the transition edges AT12 and AT22 occurs in the specific write cycle CW2.

In one embodiment, the power supply unit 202 further includes at least a pull-down unit 1036, wherein the pull-down unit 1036 is connected in parallel with the pull-down unit 1031 through the node 1022, and is to be switched in the specific write cycle CW2 for generating the voltage level V62 after the pull-down units 1031 and 1032 are sequentially switched. The pull-down unit 1036 receives a signal AN6 having a transition edge AT31, and is turned on in response to the transition edge AT61 for generating the second voltage level V62. The signal AN6 may be an enable signal, and further have a transition edge AT62 and an enable duration AS61 between the transition edges AT61 and AT62. The pull-down unit 1036 is turned off in response to the transition edge AT62 for generating the voltage level V63.

In one embodiment, in order to eliminate the undershoot, the power supply unit 202 includes a plurality of pull-down units 1031, 1032 . . . and 1036 receiving the plurality of signals AN1, AN2 . . . and AN6, respectively, wherein the plurality of signals AN1, AN2 . . . and AN6 may be a plurality of pulse signals, respectively. The plurality of signals AN1, AN2 . . . and AN6 respectively enable the pull-down units 1031, 1032 . . . and 1036 to be turned on in the specific write cycle CW2 sequentially to lower the voltage level V61 to the voltage level V62.

In one embodiment with reference to FIG. 1C, the memory device 20 has a data bit DB2, and writes the data bit DB2 to the memory cell 1011 in the specific write cycle CW2 under the supply voltage $V6_{DD}$ by driving the word line WL11 and the bit lines BL1 and BL1_Bar.

Figure 4A:
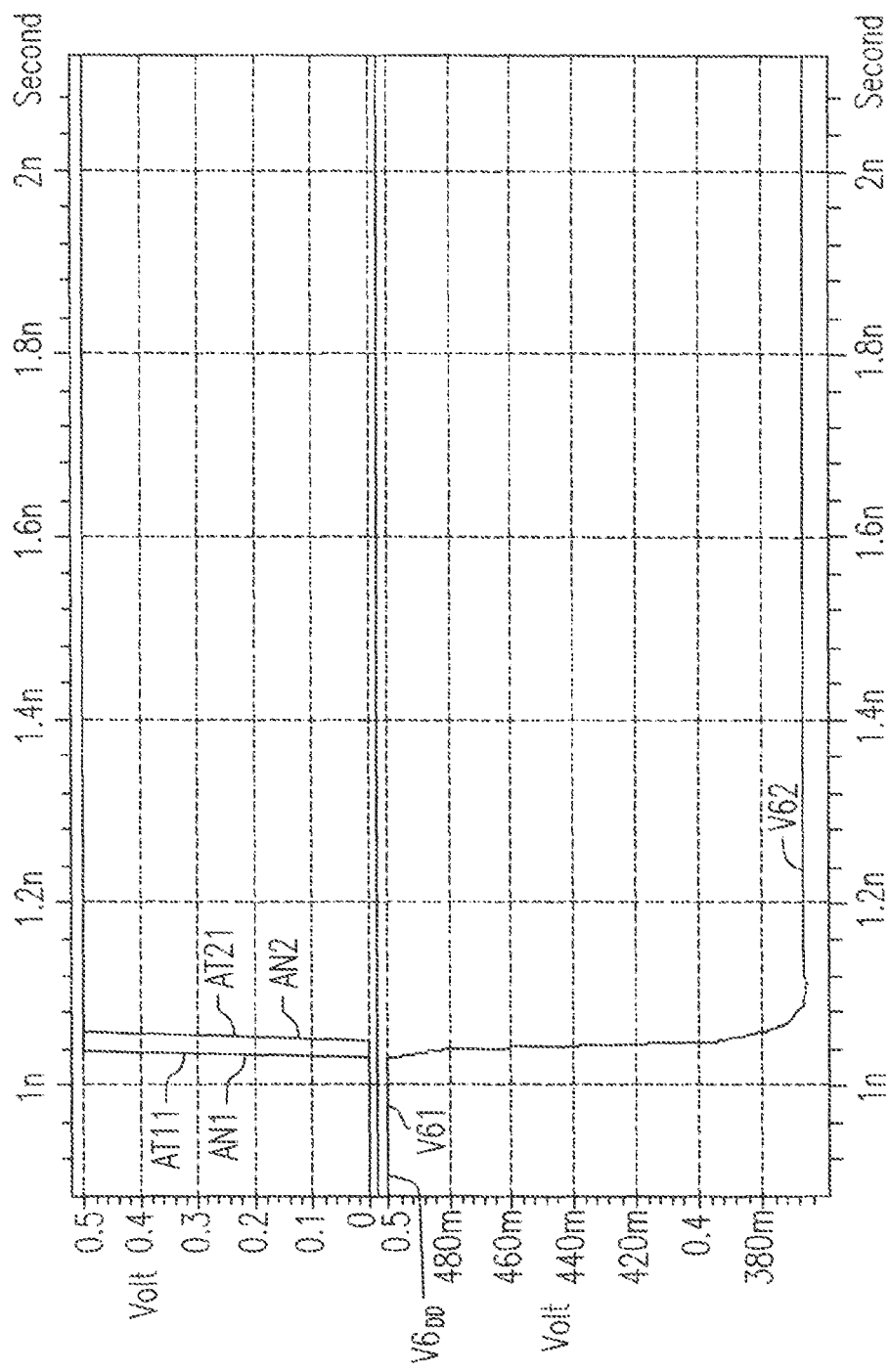
FIG. 4A and FIG. 4B are schematic diagrams showing waveforms obtained from the memory device in FIG. 3.
Figure 4B:
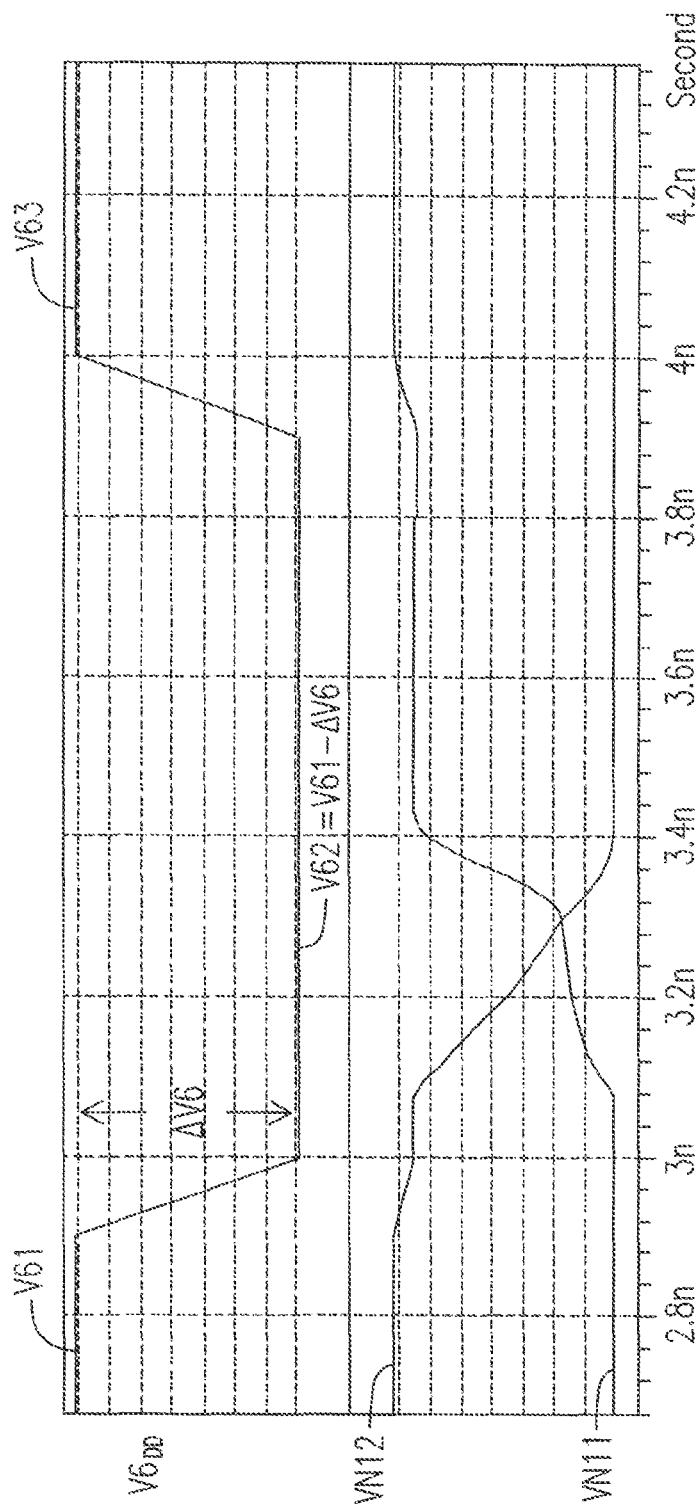

FIG. 4A and FIG. 4B are schematic diagrams showing waveforms obtained from the memory device 20 in FIG. 3. The waveforms in FIG. 4A show the signal AN1, the signal AN2, the supply voltage $V6_{DD}$ in a first period, respectively, when the memory device 20 is in a third condition. The waveforms in FIG. 4B show the supply voltage $V6_{DD}$ in a second period, and the node voltages VN11 and VN12 (shown in FIG. 1C), respectively, when the memory device 20 is in the third condition. According to the waveforms in FIGS. 4A and 4B, a specific write operation to the memory cell 1011 is successful in a specific write cycle of the memory cell 1011, wherein the write success may result from the elimination or reduction of the undershoot in the supply voltage $V6_{DD}$.

As shown in FIG. 4A and FIG. 4B, the power supply unit 202 lowers the supply voltage $V6_{DD}$ from the voltage level V61 to the voltage level V62 (=V61-AV6) in response to the transition edges AT11 and AT21.

In one embodiment, the transition edge AT21 may lag behind the transition edge AT11 by a time interval ranging from 10 to 100 picoseconds. In a specific embodiment, the time interval ranges from 20 to 40 picoseconds. The signal timing control of the plurality of signals AN1, AN2 . . . and AN6 for the memory device 20 can achieve a more reliable write assist without hurting the data retention of the unselected memory cells 1012 . . . and 1016. In one embodiment, the plurality of signals AN1, AN2 . . . and AN6 are configured to have different enable-signal timing configurations to generate different waveforms of the supply voltage $V6_{DD}$ and eliminate the undershoot issue.

Figure 5:
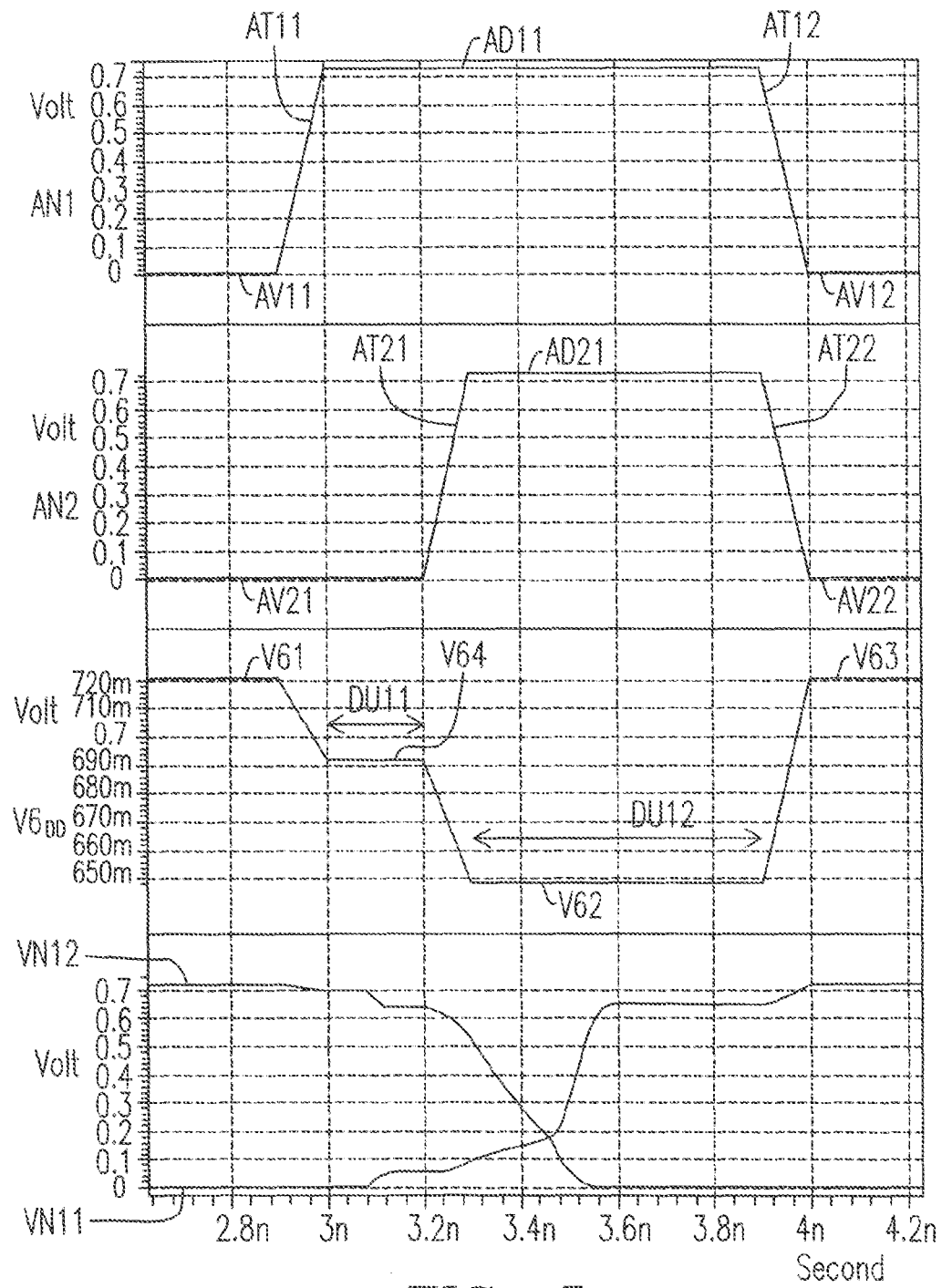
FIG. 5 is a schematic diagram showing a second set of waveforms obtained from the memory device in FIG. 3.

FIG. 5 is a schematic diagram showing waveforms obtained from the memory device 20 in FIG. 3. The waveforms in FIG. 5 show the signal AN1, the signal AN2, the supply voltage $V6_{DD}$ and the node voltages VN11 and VN12 (shown in FIG. 1C), respectively, when the memory device 20 is in a fourth condition. According to the waveforms in FIG. 5, a specific write operation to the memory cell 1011 is successful in a specific write cycle of the memory cell 1011.

As shown in FIG. 5, the signal AN1 further has a disable level AV11, an enable level AD11 and a disable level AV12, wherein the transition edge AT11 is changed from the disable level AV11 to the enable level AD11, and the transition edge AT12 is changed from the enable level AD11 to the disable level AV11. The signal AN2 further has a disable level AV21, an enable level AD21 and a disable level AV22, wherein the transition edge AT21 is changed from the disable level AV21 to the enable level AD21, and the transition edge AT22 is changed from the enable level AD21 to the disable level AV21. The transition edge AT22 may be in phase with the transition edge AT21.

In one embodiment, the power supply unit 202 keeps the supply voltage $V6_{DD}$ at the voltage level V61 when the pull-down unit 1031 is in the off-state SF11 in response to the disable level AV11 and the pull-down unit 1032 is in the off-state SF21 in response to the disable level AV21. The power supply unit 202 pulls down the supply voltage $V6_{DD}$ from the voltage level V61 to a voltage level V64 between the voltage levels V61 and V62 when the pull-down unit 1031 is turned on to change the off-state SF11 into the on-state SN11 in response to the transition edge AT11 and the pull-down unit 1032 is in the off-state SF21. The power supply unit 202 keeps the supply voltage $V6_{DD}$ at the voltage level V64 for a predetermined duration DU11 when the pull-down unit 1031 is in the on-state SN11 in response to the enable level AD11 and the pull-down unit 1032 is in the off-state SF21.

The power supply unit 202 pulls down the supply voltage $V6_{DD}$ from the voltage level V64 to the voltage level V62 when the pull-down unit 1031 is in the on-state SN11 and the pull-down unit 1032 is turned on to change the off-state SF21 into the on-state SN21 in response to the transition edge AT21. The power supply unit 202 keeps the supply voltage $V6_{DD}$ at the voltage level V62 for a predetermined duration DU12 when the pull-down unit 1031 is in the on-state SN11 and the pull-down unit 1032 is in the on-state SN21 in response to the enable level AD21. The power supply unit 202 pulls up the supply voltage $V6_{DD}$ from the voltage level V62 to the voltage level V63 when the pull-down unit 1031 is turned off to change the on-state SN11 into the off-state SF12 in response to the transition edge AT12 and the pull-down unit 1032 is turned off to change the on-state SN21 into the off-state SF22 in response to the transition edge AT22. For instance, the voltage level V63 may be equal to the voltage level V61.

In one embodiment, the predetermined duration DU12 may be a lower-voltage-level duration, and be limited to avoid having a data retention failure to the memory cells 1012 . . . and 1016 in the specific write cycle of the memory cell 1011.

Figure 6:
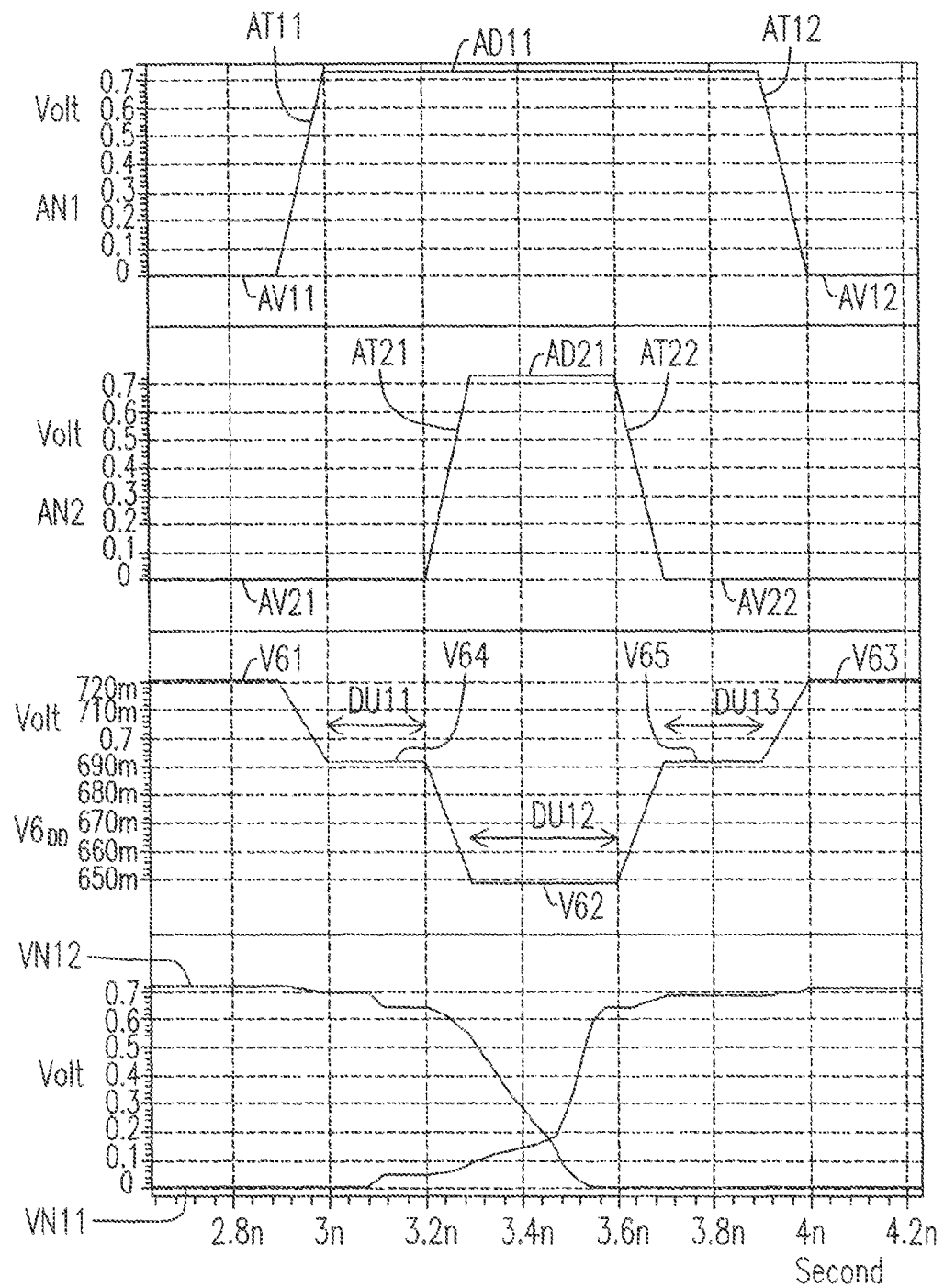
FIG. 6 is a schematic diagram showing a third set of waveforms obtained from the memory device in FIG. 3.

FIG. 6 is a schematic diagram showing waveforms obtained from the memory device 20 in FIG. 3. The waveforms in FIG. 6 show the signal AN1, the signal AN2, the supply voltage $V6_{DD}$ and the node voltages VN11 and VN12 (shown in FIG. 1C), respectively, when the memory device 20 is in a fifth condition. According to the waveforms in FIG. 6, a specific write operation to the memory cell 1011 is successful in a specific write cycle of the memory cell 1011. The third set of waveforms in FIG. 6 is similar to the second set of waveforms in FIG. 5, and the characteristics of the waveforms in FIG. 6 are described as follows.

The transition edge AT22 may lead the transition edge AT21. The power supply unit 202 pulls up the supply voltage $V6_{DD}$ from the voltage level V62 to a voltage level V65 between the voltage levels V62 and V63 when the pull-down unit 1032 is in the on-state SN11 in response to the enable level AD11 and the pull-down unit 1031 is turned off to change the on-state SN21 into the off-state SF22 in response to the transition edge AT22. The power supply unit 202 keeps the supply voltage $V6_{DD}$ at the voltage level V65 for a predetermined duration DU13 when the pull-down unit 1031 is in the on-state SN1 and the pull-down unit 1032 is in the off-state SF22 in response to the disable level AV22.

The power supply unit 202 pulls up the supply voltage $V6_{DD}$ from the voltage level V65 to the voltage level V63 when the pull-down unit 1031 is turned off to change the on-state SN11 into the off-state SF12 in response to the transition edge AT12 and the pull-down unit 1032 is in the off-state SF22. For instance, the voltage level V65 may be equal to the voltage level V64.

In one embodiment, the predetermined duration DU12 in FIG. 6 may be a lower-voltage-level duration, and be limited to avoid having a data retention failure to the memory cells 1012 . . . and 1016 in the specific write cycle of the memory cell 1011. For instance, the predetermined duration DU12 in FIG. 6 may be shorter than the predetermined duration DU12 in FIG. 5. In one embodiment, different power-line lowering voltage-level waveforms may improve a write margin of the memory cell 1011 without hurting a data retention limitation of the memory cells 1012 . . . and 1016 in a specific write cycle of the memory cell 1011.

Figure 7:
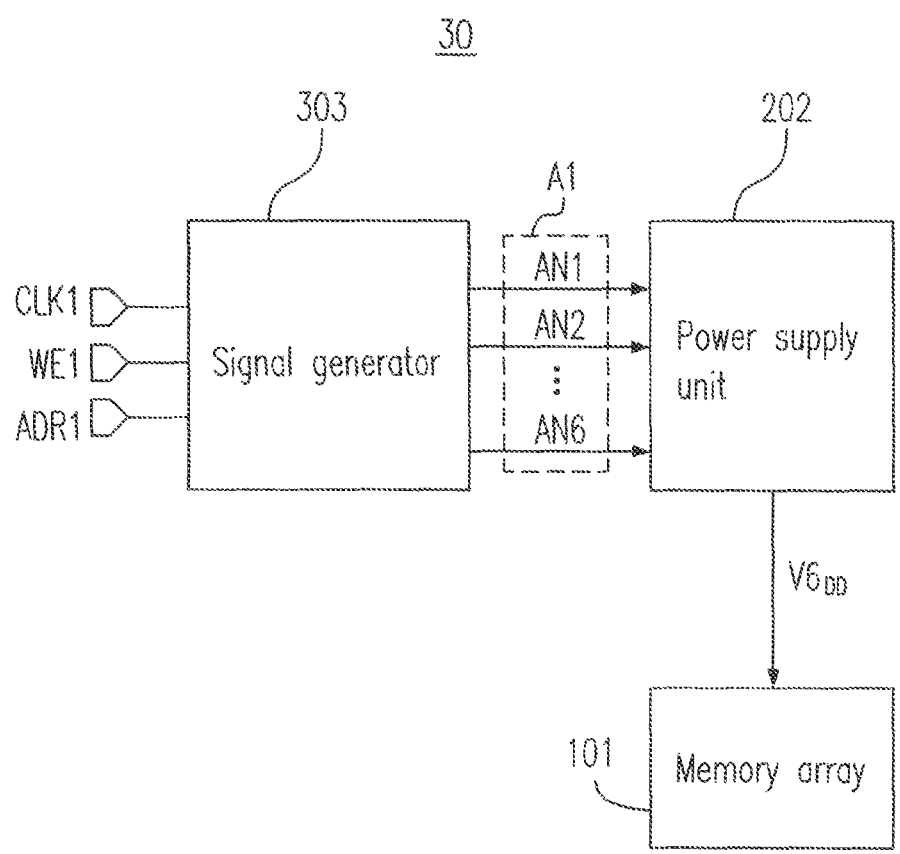
FIG. 7 is a schematic diagram showing a memory device according to a third embodiment of the present disclosure.

FIG. 7 is a schematic diagram showing a memory device 30 according to a third embodiment of the present disclosure. The memory device 30 includes a memory array 101, a power supply unit 202 coupled to the memory array 101 and a signal generator 303 coupled to the power supply unit 202. The signal generator 303 may be a pulse controller, and generate a control signal A1 in response to a clock signal CLK1, a write enable signal WE1 and an address signal ADR1, wherein the control signal A1 may include the plurality of signals AN1, AN2 . . . and AN6. The power supply unit 202 provides the supply voltage $V6_{DD}$ to the memory array 101 in response to the control signal A1.

In one embodiment, the power supply unit 202 of the memory device 30 can achieve a reliable power-line lowering voltage level, which can avoid a data retention failure to the memory cells 1012 . . . and 1016 in the specific write cycle of the memory cell 1011.

Figure 8:
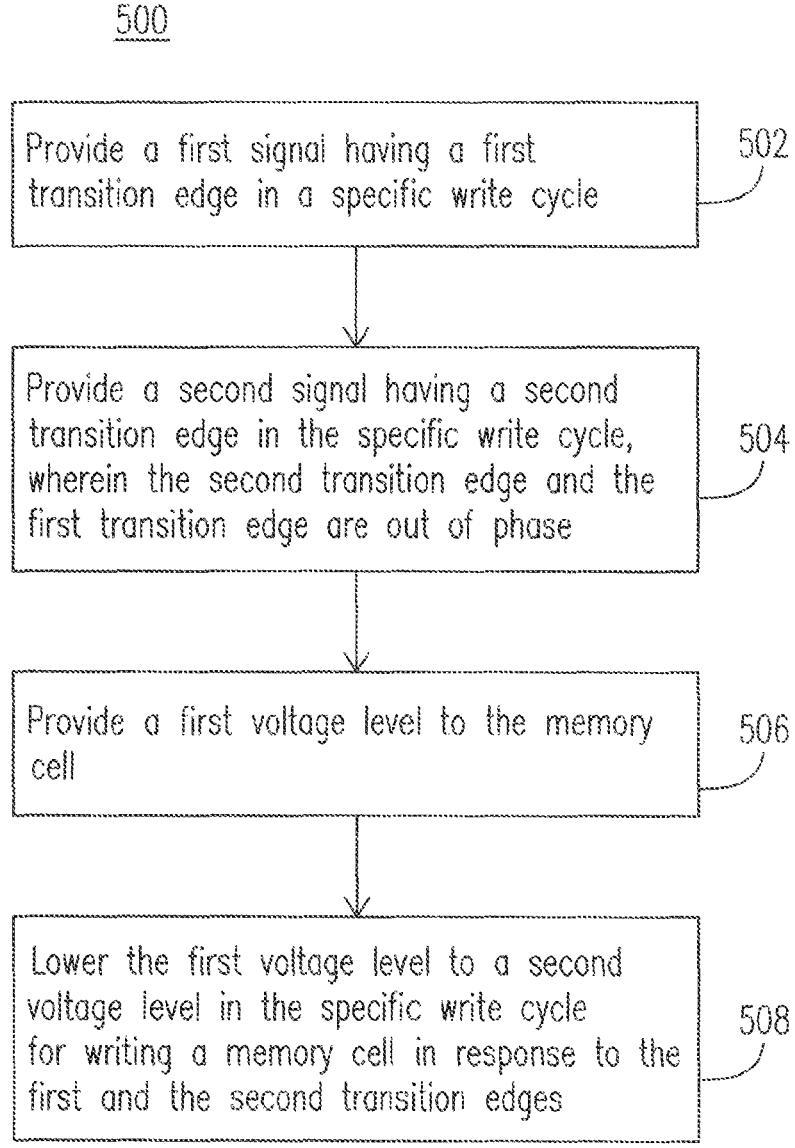
FIG. 8 is a flowchart showing a method for writing a memory cell of the memory device in FIG. 3 in a specific write cycle.

FIG. 8 is a flowchart showing a method 500 for writing a memory cell 1011 of the memory device 20 in FIG. 3 in a specific write cycle CW2. In step 502, a signal AN1 having a transition edge AT11 is provided in the specific write cycle CW2. In step 504, a signal AN2 having a transition edge AT21 is provided in the specific write cycle CW2, wherein the transition edges AT21 and AT11 are out of phase. In step 506, a voltage level V61 is provided to the memory cell 1011. In step 508, the voltage level V61 is lowered to a voltage level V62 in the specific write cycle CW2 for writing the memory cell 1011 in response to the transition edges AT11 and AT21.

In one embodiment, the voltage levels V61 and V62 occur when the memory cell 1011 is powered by a supply voltage V6$_{DD}$. The transition edge AT21 lags behind the transition edge AT11. The signal AN1 further has a disable level AV11, an enable level AD11, a disable level AV12 and a transition edge AT12 changed from the enable level AD11 to the disable level AV12, wherein the transition edge AT11 is changed from the disable level AV11 to the enable level AD11. The signal AN2 further has a disable level AV21, an enable level AD21, a disable level AV22 and a transition edge AT22 changed from the enable level AD21 to the disable level AV22, wherein the transition edge AT21 is changed from the disable level AV21 to the enable level AD21. For instance, the transition edge AT22 is in one of a first state and a second state; the first state is that the transition edge AT22 is in phase with the transition edge AT12; and the second state is that the transition edge AT22 leads the transition edge AT12.

In one embodiment, the method 500 further includes the following steps. A positive supply voltage V1$_{DD}$ is provided. The supply voltage V6$_{DD}$ is pulled up to have the voltage level V61 by the positive supply voltage V1$_{DD}$ in response to the disable levels AV11 and AV21. The supply voltage V6$_{DD}$ is kept at a voltage level V64 between the voltage levels V61 and V62 for a predetermined duration DU11 in response to the enable level AD11 and the disable level AV21. The supply voltage V6$_{DD}$ is kept at the voltage level V62 for a predetermined duration DU12 in response to the enable levels AD11 and AD21.

In one embodiment with reference to FIG. 1C and FIG. 7, the method 500 further includes the following steps. A data bit DB2, a clock signal CLK1, a write enable signal WE1 and an address signal ADR1 are provided. The signals AN1 and AN2 are generated in response to the clock signal CLK1, the write enable signal WE1 and the address signal ADR1. The data bit DB2 is written to the memory cell 1011 in the specific write cycle CW2 under the supply voltage V6$_{DD}$.

In other embodiments, a method for writing a memory cell 1011 in a specific write cycle CW2 includes the following steps. A first signal AN1 having a first transition edge AT11 is provided in the specific write cycle CW2. A second signal AN2 having a second transition edge AT21 is provided in the specific write cycle CW2, wherein the second transition edge AT21 lags behind the first transition edge AT11. A first voltage level V61 is provided to the memory cell 1011. The first voltage level V61 is lowered to a second voltage level V62 in the specific write cycle CW2 for writing the memory cell 1011 in response to the second transition edge AT21. In one embodiment, the first voltage level V61 is lowered to the second voltage level V62 in response to the transition edges AT11 and AT21.

EMBODIMENTS

1. A memory device includes a memory cell, a first pull-down unit and a second pull-down unit coupled to the first pull-down unit. The memory cell is to be written in a specific write cycle. The first and the second pull-down units are sequentially switched in the specific write cycle.

2. The memory device according to Embodiment 1, wherein: the memory cell includes a power input terminal; the memory device further includes a node and a pull-up unit; the node is coupled to the power input terminal; and the pull-up unit includes a first terminal receiving a positive supply voltage and a second terminal coupled to the node, wherein the first pull-down unit is connected in parallel with the second pull-down unit through the node.

3. The memory device according to Embodiments 1-2, wherein: the memory device has the positive supply voltage; the node transmits a first supply voltage to the memory cell; the first supply voltage is pulled up to a first voltage level by the positive supply voltage when the first pull-down unit is turned off to be in a first off-state and the second pull-down unit is turned off to be in a second off-state; and the first supply voltage is pulled down from the first voltage level to a second voltage level for writing the memory cell when the first and the second pull-down units are sequentially turned on in the specific write cycle to change the first off-state into a first on-state and the second off-state into a second on-state sequentially.

4. The memory device according to Embodiments 1-3, wherein: the first supply voltage is kept at a third voltage level between the first and the second voltage levels for a first predetermined duration when the first pull-down unit is in the first on-state and the second pull-down unit is in the first off-state; and the first supply voltage is kept at the second voltage level for a second predetermined duration when the first pull-down unit is in the first on-state and the second pull-down unit is in the second on-state.

5. The memory device according to Embodiments 1-4, further comprising at least a third pull-down unit, wherein the third pull-down unit is connected in parallel with the first pull-down unit through the node, and is to be switched in the specific write cycle for generating the second voltage level after the first and the second pull-down units are sequentially switched.

6. The memory device according to Embodiments 1-5, wherein: the memory cell is a static random access memory cell; the first pull-down unit receives a first signal having a first transition edge and is turned on in response to the first transition edge; and the second pull-down unit receives a second signal having a second transition edge lagging behind the first transition edge, and is turned on in response to the second transition edge.

7. The memory device according to Embodiments 1-6 further includes a signal generator, a word line, a first bit line and a second bit line, wherein: the signal generator generates the first and the second signals in response to a clock signal, a write enable signal and an address signal; the word line is coupled to the memory cell; the first bit line is coupled to the memory cell; and the second bit line coupled to the memory cell, wherein the memory device has a data bit, and writes the data bit to the memory cell in the specific write cycle under the first supply voltage by driving the word line and the first and the second bit lines.

8. The memory device according to Embodiments 1-7, wherein: the first signal is a first enable signal and further has a third transition edge and a first enable duration between the first transition edge and the third transition edge; the second signal is a second enable signal and further has a fourth transition edge and a second enable duration between the second transition edge and the fourth transition edge; and the fourth transition edge is in one of: a first state that the fourth transition edge is in phase with the third transition edge; and a second state that the fourth transition edge leads the third transition edge.

9. A method for writing a memory cell in a specific write cycle includes steps of: providing a first signal having a first transition edge in the specific write cycle; providing a second signal having a second transition edge in the specific write cycle, wherein the second transition edge and the first transition edge are out of phase; providing a first voltage level to the memory cell; and lowering the first voltage level to a second voltage level in the specific write cycle for writing the memory cell in response to the first and the second transition edges.

10. The method according to Embodiment 9, wherein: the first voltage level and the second voltage level occur when the memory cell is powered by a first supply voltage; the second transition edge lags behind the first transition edge; the first signal further has a first disable level, a first enable level, a second disable level and a third transition edge changed from the first enable level to the second disable level, wherein the first transition edge is changed from the first disable level to the first enable level; and the second signal further has a third disable level, a second enable level, a fourth disable level and a fourth transition edge changed from the second enable level to the fourth disable level, wherein the second transition edge is changed from the third disable level to the second enable level.

11. The method according to Embodiments 9-10, further comprising steps of: providing a positive supply voltage; and pulling up the first supply voltage to have the first voltage level by the positive supply voltage in response to the first and the third disable levels.

12. The method according to Embodiments 9-11, further comprising steps of: keeping the first supply voltage at a third voltage level between the first and the second voltage levels for a first predetermined duration in response to the first enable level and the third disable level; and keeping the first supply voltage at the second voltage level for a second predetermined duration in response to the first enable level and the second enable level.

13. The method according to Embodiments 9-12, wherein: the fourth transition edge is in one of: a first state that the fourth transition edge is in phase with the third transition edge; and a second state that the fourth transition edge leads the third transition edge.

14. The method according to Embodiments 9-13, further comprising steps of: providing a data bit, a clock signal, a write enable signal and an address signal; generating the first and the second enable signals in response to the clock signal, the write enable signal and the address signal; and writing the data bit to the memory cell in the specific write cycle under the first supply voltage.

15. A method for writing a memory cell in a specific write cycle, comprising steps of: providing a first signal having a first transition edge in the specific write cycle; providing a second signal having a second transition edge in the specific write cycle, wherein the second transition edge lags behind the first transition edge; providing a first voltage level to the memory cell; and lowering the first voltage level to a second voltage level in the specific write cycle for writing the memory cell in response to the second transition edge.

16. The method according to Embodiment 15, wherein: the first voltage level and the second voltage level occur when the memory cell is powered by a first supply voltage; the first voltage level is lowered to the second voltage level in response to the first and the second transition edges; the first signal further has a first disable level, a first enable level, a second disable level and a third transition edge changed from the first enable level to the second disable level, wherein the first transition edge is changed from the first disable level to the first enable level; and the second signal further has a third disable level, a second enable level, a fourth disable level and a fourth transition edge changed from the second enable level to the fourth disable level, wherein the second transition edge is changed from the third disable level to the second enable level.

17. The method according to Embodiments 15-16, further comprising steps of: providing a positive supply voltage; and pulling up the first supply voltage to have the first voltage level by the positive supply voltage in response to the first and the third disable levels.

18. The method according to Embodiments 15-17, further comprising steps of: keeping the first supply voltage at a third voltage level between the first and the second voltage levels for a first predetermined duration in response to the first enable level and the third disable level; and keeping the first supply voltage at the second voltage level for a second predetermined duration in response to the first enable level and the second enable level.

19. The method according to Embodiments 15-18, wherein the fourth transition edge is in one of: a first state that the fourth transition edge is in phase with the third transition edge; and a second state that the fourth transition edge leads the third transition edge.

20. The method according to Embodiments 15-19, further comprising steps of: providing a data bit, a clock signal, a write enable signal and an address signal; generating the first and the second enable signals in response to the clock signal, the write enable signal and the address signal; and writing the data bit to the memory cell in the specific write cycle under the first supply voltage.

In accordance with some embodiments, a memory device comprises a memory cell electrically connected to a power line and a power supply unit configured to control a voltage level on the power line. The power supply unit is further configured to receive a control signal corresponding to a write cycle of the memory cell, responsive to a first state of the control signal, output a first voltage level on the power line, and, responsive to a second state of the control signal, output a second voltage level on the power line, the second voltage level having a magnitude less than a magnitude of the first voltage level.

In accordance with some embodiments, a memory device comprises a memory cell electrically connected to a power line and a power supply unit configured to receive a first supply voltage and output a second supply voltage on the power line. The power supply unit comprises a first pull-down unit configured to receive a first signal corresponding to a write cycle of the memory cell and a second pull-down unit configured to receive a second signal corresponding to the write cycle of the memory cell. The power supply unit is configured to output the second supply voltage having a voltage level based on the first signal and the second signal.

In accordance with some embodiments, a memory device comprises a memory array configured to receive a supply voltage, a power supply unit configured to output the supply voltage at one voltage level of a plurality of voltage levels based on a control signal, and a signal generator configured to output the control signal based on a clock signal, a write enable signal, and an address signal. Two voltage levels of the plurality of voltage levels correspond to the control signal generated in response to a write operation to a memory cell in the memory array.

A skilled person in the art will appreciate that there can be many variations to the embodiments of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A memory device, comprising:
    a memory cell electrically connected to a power line; and
    a power supply unit configured to control a voltage level on the power line, the power supply unit further configured to:
        receive a control signal corresponding to a write cycle of the memory cell;
        responsive to a first state of the control signal, output a first voltage level on the power line, wherein the first voltage level is lower than a power supply voltage level; and
        responsive to a second state of the control signal, output a second voltage level on the power line, the second voltage level having a magnitude less than a magnitude of the first voltage level.

2. The memory device of claim 1, wherein the power supply unit is configured to receive a plurality of signals which collectively constitute the control signal, and the first state of the control signal comprises:
    a first signal of the plurality of signals having an enable level; and
    a second signal of the plurality of signals having a disable level.

3. The memory device of claim 1, wherein the power supply unit is configured to receive a plurality of signals which collectively constitute the control signal, and the second state of the control signal comprises:
    a first signal of the plurality of signals having a first enable level; and
    a second signal of the plurality of signals having a second enable level.

4. The memory device of claim 1, wherein, during the write cycle of the memory cell, the power supply unit is configured to receive the control signal having the first state for a first duration followed by the second state for a second duration.

5. The memory device of claim 4, wherein, during the write cycle of the memory cell, the power supply unit is further configured to receive the control signal having the first state for a third duration following the first duration and the second duration.

6. The memory device of claim 1, further comprising a signal generator configured to generate the control signal in response to a clock signal and a write enable signal.

7. The memory device of claim 1, wherein the power supply unit comprises a first pull-down unit and a second pull-down unit, and wherein:
    the power supply unit is configured to receive a plurality of signals which collectively constitute the control signal,
    a first enable level of a first signal of the plurality of signals causes the first pull-down unit to have a first on-state, and
    a second enable level of a second signal of the plurality of signals causes the second pull-down unit to have a second on-state.

8. The memory device of claim 1, wherein the power supply unit comprises a first pull-down unit and a second pull-down unit, the power supply unit thereby being configured to:
    output a third voltage level, greater than the first voltage level, in response to a first off-state of the first pull-down unit and a second off-state of the second pull-down unit;
    output the first voltage level in response to a first on-state of the first pull-down unit and the second off-state of the second pull-down unit; and
    output the second voltage level in response to the first on-state of the first pull-down unit and a second on-state of the second pull-down unit.

9. A memory device, comprising:
    a memory cell electrically connected to a power line; and
    a power supply unit configured to receive a first supply voltage and output a second supply voltage on the power line, the power supply unit comprising:
        a first pull-down unit configured to receive a first signal corresponding to a write cycle of the memory cell; and
        a second pull-down unit configured to receive a second signal corresponding to the write cycle of the memory cell, wherein
        the power supply unit is configured to output the second supply voltage having a voltage level based on the first signal and the second signal.

10. The memory device of claim 9, wherein each of the first pull-down unit and the second pull-down unit is connected between the power line and a ground.

11. The memory device of claim 10, the power supply unit further comprising a pull-up unit configured to receive the first supply voltage and electrically connected to the power line.

12. The memory device of claim 11, wherein the pull-up unit comprises a p-type metal oxide semiconductor (PMOS) transistor.

13. The memory device of claim 9, wherein
    the first pull-down unit comprises a first n-type metal oxide semiconductor (NMOS) transistor having a first channel-width-to-channel-length ratio, and
    the second pull-down unit comprises a second NMOS transistor having a second channel-width-to-channel-length ratio different from the first channel-width-to-channel-length ratio.

14. The memory device of claim 9, wherein
    the first pull-down unit comprises a first n-type metal oxide semiconductor (NMOS) transistor having a first channel-width-to-channel-length ratio, and
    the second pull-down unit comprises a second NMOS transistor having the first channel-width-to-channel-length ratio.

15. The memory device of claim 9, wherein:
the voltage level has a first value corresponding to a first off-state of the first pull-down unit and a second off-state of the second pull-down unit;
the voltage level has a second value corresponding to a first on-state of the first pull-down unit and the second off-state of the second pull-down unit, the second value being less than the first value; and
the voltage level has a third value corresponding to the first on-state of the first pull-down unit and a second on-state of the second pull-down unit, the third value being less than the second value.

16. The memory device of claim 9, further comprising a signal generator configured to generate the first signal and the second signal in response to a clock signal and a write enable signal.

17. A memory device, comprising:
a memory array configured to receive a supply voltage;
a power supply unit configured to output the supply voltage at one voltage level of a plurality of voltage levels based on a control signal; and
a signal generator configured to output the control signal based on a clock signal, a write enable signal, and an address signal, wherein two voltage levels of the plurality of voltage levels correspond to the control signal generated in response to a write operation to a memory cell in the memory array.

18. The memory device of claim 17, wherein the power supply unit comprises a first pull-down unit and a second pull-down unit, the power supply unit thereby being configured to have:
a first off-state of the first pull-down unit and a second off-state of the second pull-down unit cause the power supply unit to output a first voltage level of the plurality of voltage levels;
a first on-state of the first pull-down unit and the second off-state of the second pull-down unit cause the power supply unit to output a second voltage level of the plurality of voltage levels less than the first voltage level of the plurality of voltage levels; and
the first on-state of the first pull-down unit and a second on-state of the second pull-down unit cause the power supply unit to output a third voltage level of the plurality of voltage levels less than the second voltage level of the plurality of voltage levels, wherein
the second voltage level of the plurality of voltage levels and the third voltage level of the plurality of voltage levels are the two voltage levels of the plurality of voltage levels corresponding to the control signal generated in response to the write operation to the memory cell in the memory array.

19. The memory device of claim 17, wherein the signal generator is further configured to generate the control signal to have, during the write cycle of the memory cell, a first state for a first duration corresponding to a first voltage level of the two voltage levels of the plurality of voltage levels followed by a second state for a second duration corresponding to a second voltage level of the two voltage levels of the plurality of voltage levels.

20. The memory device of claim 19, wherein the signal generator is further configured to generate the control signal to have, during the write cycle of the memory cell, the first state for a third duration following the first duration and the second duration.

* * * * *